United States Patent
Matsumoto et al.

(10) Patent No.: US 10,343,406 B2
(45) Date of Patent: Jul. 9, 2019

(54) LIQUID EJECTION HEAD MANUFACTURING METHOD

(71) Applicant: CANON KABUSHIKI KAISHA, Tokyo (JP)

(72) Inventors: Keiji Matsumoto, Fukushima (JP); Jun Yamamuro, Yokohama (JP); Kazuhiro Asai, Kawasaki (JP); Koji Sasaki, Nagareyama (JP); Kunihito Uohashi, Yokohama (JP); Seiichiro Yaginuma, Kawasaki (JP); Ryotaro Murakami, Yokohama (JP); Masahisa Watanabe, Yokohama (JP); Tomohiko Nakano, Kawasaki (JP); Keiji Edamatsu, Kawasaki (JP); Haruka Nakada, Date-gun (JP); Kenji Fujii, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 201 days.

(21) Appl. No.: 15/391,417

(22) Filed: Dec. 27, 2016

(65) Prior Publication Data

US 2017/0203569 A1   Jul. 20, 2017

(30) Foreign Application Priority Data

Jan. 19, 2016  (JP) ................................. 2016-007739

(51) Int. Cl.
  *B41J 2/16*   (2006.01)
  *G03F 7/029*  (2006.01)

(52) U.S. Cl.
  CPC .............. *B41J 2/164* (2013.01); *B41J 2/161* (2013.01); *B41J 2/162* (2013.01); *B41J 2/1603* (2013.01);
  (Continued)

(58) Field of Classification Search
  CPC . B41J 2/1603; B41J 2/161; B41J 2/162; B41J 2/1628; B41J 2/1629; B41J 2/1631;
  (Continued)

(56) References Cited

U.S. PATENT DOCUMENTS 4,394,670 A   7/1983 Sugitani et al.
5,322,762 A * 6/1994 Kushi ................. G03F 7/029
                                                430/288.1
(Continued)

FOREIGN PATENT DOCUMENTS

CN    1880080 A    12/2006
CN    101607477 A  12/2009
(Continued)

OTHER PUBLICATIONS

First Office Action in Chinese Application No. 201710027199.0 (dated Sep. 18, 2018).

(Continued)

*Primary Examiner* — A. Dexter Tugbang
(74) *Attorney, Agent, or Firm* — Venable LLP

(57) ABSTRACT

A liquid ejection head has an ejection port forming region which includes liquid ejection energy generating elements arranged on a substrate, liquid supply ports each running through the substrate and having an opening at a surface of the substrate, a liquid path formed on the surface as a space containing the liquid ejection energy generating elements and the liquid supply ports therein, and ejection ports corresponding to the respective liquid ejection energy generating elements. The liquid ejection head is manufactured by forming a liquid path forming layer on the substrate using a dry film resist, forming an ejection port forming layer on the liquid path forming layer, forming a liquid path in the liquid path forming layer and ejection ports in the ejection port forming layer. The substrate has dummy holes each having an opening at a surface of the substrate outside the ejection port forming region.

9 Claims, 3 Drawing Sheets

(52) U.S. Cl.
CPC ........... *B41J 2/1628* (2013.01); *B41J 2/1629* (2013.01); *B41J 2/1631* (2013.01); *B41J 2/1632* (2013.01); *B41J 2/1635* (2013.01); *B41J 2/1642* (2013.01); *G03F 7/029* (2013.01); *Y10T 29/49083* (2015.01); *Y10T 29/49401* (2015.01)

(58) Field of Classification Search
CPC ........ B41J 2/1632; B41J 2/1635; B41J 2/164; B41J 2/1642; G03F 7/029; Y10T 29/49083; Y10T 29/49401
See application file for complete search history.

(56) References Cited

U.S. PATENT DOCUMENTS

| | | | |
|---|---|---|---|
| 5,872,583 A * | 2/1999 | Yamamoto | B41J 2/161 347/20 |
| 7,670,757 B2 | 3/2010 | Shiba et al. | |
| 7,678,536 B2 | 3/2010 | Hatta | |
| 8,083,324 B2 | 12/2011 | Kwon et al. | |
| 8,272,130 B2 | 9/2012 | Miyazaki | |
| 9,090,067 B2 | 7/2015 | Ohsumi et al. | |
| 9,802,410 B2 | 10/2017 | Miyazaki | |
| 2009/0315956 A1* | 12/2009 | Ishida | B41J 2/1603 347/63 |

FOREIGN PATENT DOCUMENTS

| | | | |
|---|---|---|---|
| CN | 1977218 B | | 12/2010 |
| JP | 57-208251 A | | 12/1982 |
| JP | 2001018400 A | * | 1/2001 |
| JP | 2001-088309 A | | 4/2001 |
| JP | 2015-093445 A | | 5/2015 |

OTHER PUBLICATIONS

Second Office Action in Chinese Application No. 201710027199.0 (dated Apr. 23, 2019).
Lu Zhilun (ed.), Electronic Product Assembling Processes and Equipments, pp. 92-112 (Jan. 2009).
English Language Translation of Lu Zhilun (ed.), Electronic Product Assembling Processes and Equipments, pp. 94-96 (Jan. 2009).

* cited by examiner

LIQUID EJECTION HEAD MANUFACTURING METHOD

BACKGROUND OF THE INVENTION

Field of the Invention

The present invention relates to a method of manufacturing a liquid ejection head to be used for visual recordings using ink or some other liquid.

Description of the Related Art

A method of manufacturing a liquid ejection head by forming nozzles (ejection ports) on a substrate having a through hole (ink supply port) running through the substrate by means of dry film resist is known (see the specification of U.S. Pat. No. 8,083,324). With the above-identified method, a structure having nozzles can be formed by forming a liquid path layer on a substrate having a through hole so as to cover the stepped portion of the substrate and then forming an orifice plate layer thereon, which is subsequently subjected to photolithography or like techniques.

SUMMARY OF THE INVENTION

The present invention provides a method of manufacturing a liquid ejection head having an ejection port forming region including liquid ejection energy generating elements arranged on a first surface of a substrate along with electric wiring for driving the liquid ejection energy generating elements, a plurality of liquid supply ports each running through the substrate and having an opening at the first surface of the substrate, a liquid path formed on the first surface as a space containing the liquid ejection energy generating elements and the plurality of liquid supply ports therein, and ejection ports for ejecting liquid from the liquid path by driving the liquid ejection energy generating elements, the method comprising: a step of forming a liquid path forming member on the first surface of the substrate, using a first dry film resist; a step of forming an ejection port forming member on the liquid path forming member; a step of forming the liquid path in the liquid path forming member; and a step of forming the ejection ports in the ejection port forming member, wherein the substrate has dummy holes each having an opening at the first surface of the substrate outside the ejection port forming region.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

Figure 5A:
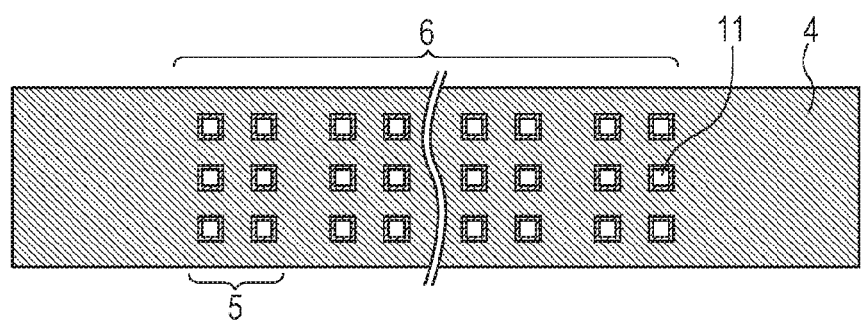
FIGS. 5A, 5B and 5C are schematic top and cross sectional views of an exemplary liquid ejection head that can be manufactured by means of a prior art manufacturing method.
Figure 5B:
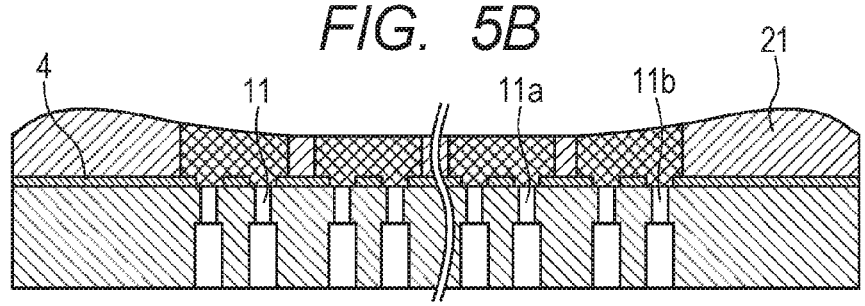
Figure 5C:
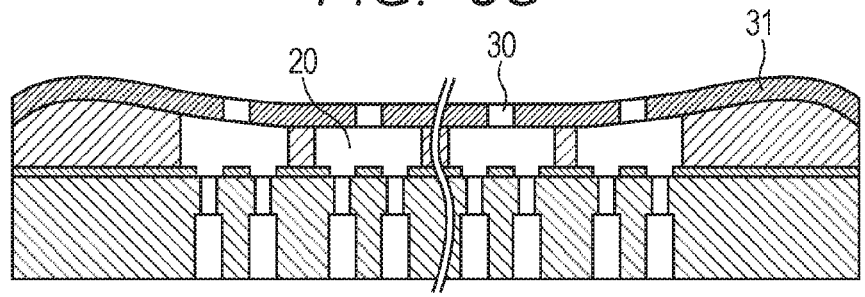

When a plurality of liquid supply ports are arranged on a surface of a substrate and run through the substrate and dry film resist is transferred onto it so as to cover the stepped portion of the substrate as described in U.S. Pat. No. 8,083,324, there can arise an instance where the surface flatness of the liquid path layer (the liquid path forming member) 21 cannot be secured as shown in FIG. 5B. More specifically, such an instance takes place because, among the plurality of liquid supply ports 11 arranged side by side as shown in FIG. 5A, fluidized resist can less easily flow into the liquid supply ports 11$b$ (through holes) arranged in the boundary portion running along the edges if compared with the liquid supply ports 11$a$ in the interior portion where each liquid supply port has adjacent ones in four directions to consequently make it difficult to secure surface flatness for the top surface of the liquid path layer. Additionally, as an orifice plate layer (ejection port forming member) 31 is formed on the liquid path layer that cannot secure surface flatness, difficulty can arise for controlling the nozzle height (the sum of the height from the upper surface of the substrate to the top end of each ejection port, or the sum of the height of the liquid path and the length of each of the ejection ports) as shown in FIG. 5C.

In view of the above-identified problem, therefore, the object of the present invention is to provide a method of manufacturing a liquid ejection head that can secure surface flatness and hence an equal nozzle height for both the boundary portion and the interior portion of the ejection port forming region where a plurality of liquid ejection ports are formed side by side so as to run through the substrate and facilitate the control of the nozzle height to achieve a good liquid ejection performance.

Figure 1:
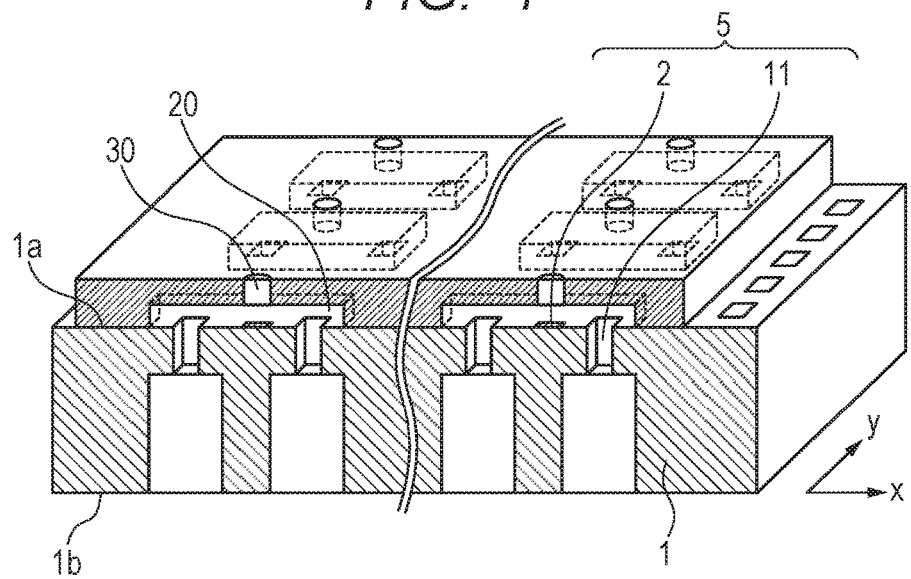
FIG. 1 is a schematic perspective view of an exemplary liquid ejection head that can be manufactured by a manufacturing method according to the present invention.

A liquid ejection head manufactured by the method of the present invention has an ejection port forming region including liquid ejection energy generating elements arranged on a first surface of a substrate along with electric wiring for driving the liquid ejection energy generating elements, a plurality of liquid supply ports each running through the substrate and having an opening at the first surface of the substrate, a liquid path formed on the first surface as a space containing the liquid ejection energy generating elements and the plurality of liquid supply ports therein, and ejection ports for ejecting liquid from the liquid path by driving the liquid ejection energy generating elements. Now, a liquid ejection head manufactured by the method of the present invention will be described by referring to FIGS. 1 and 2. FIG. 1 is a schematic perspective view of an exemplary liquid ejection head that can be manufactured by a manufacturing method according to the present invention and FIG. 2 is a schematic cross sectional view of the liquid ejection head illustrated in FIG. 1.

In the liquid ejection head illustrated in FIG. 1, a plurality of liquid ejection energy generating elements 2 is arranged at a given pitch in the y-direction to form each row of liquid ejection energy generating elements on a first surface 1$a$ of a substrate 1. Additionally, a liquid path (including liquid chambers) 20 is formed on the substrate 1 so as to contain the liquid ejection energy generating elements therein and ejection ports (or nozzles) 30 are formed at positions located right above the respective liquid ejection energy generating elements 2 so as to eject liquid from the corresponding liquid chamber of the liquid path 20. Furthermore, liquid supply ports 11 are formed to run through the substrate from the first surface 1a of the substrate 1 to the second surface 1b that is the opposite side surface of the substrate 1 such that each liquid ejection energy generating element 2 is located between a pair of liquid supply ports 11 that supply liquid to the liquid path (i.e. the liquid chamber) 20. A plurality of nozzle rows 5, each corresponding to a row of liquid ejection energy generating elements 2 and a pair of rows of liquid supply ports 11, are arranged in the x-direction in FIG. 1, although most of them are omitted and the omission is indicated by a pair of wavy lines in FIGS. 1 and 2. In each of the liquid chambers of the liquid path 20 of the liquid ejection head having the above-described configuration, as pressure is applied by the liquid ejection energy generating elements 2 to the liquid filled in the liquid path through the liquid supply ports 11, liquid droplets are ejected from the ejection ports 30. A recording operation takes place as the ejected liquid droplets are forced to adhere to a recording medium.

Insulation/protection film (not illustrated) is formed on the liquid ejection energy generating elements 2 of each of the liquid chambers and an adhesion layer 4 is formed on the insulation/protection film. In a liquid ejection head manufactured by the method of the present invention, a plurality of liquid supply ports 11 are arranged side by side in the ejection port forming region (which is also referred to as nozzle region) 6 on the substrate 1 as illustrated in FIG. 2. Additionally, outside the ejection port forming region 6 where the plurality of liquid supply ports 11 are arranged side by side, dummy holes 12 that open at least at the first surface of the substrate 1 are formed. The dummy holes are different from the liquid supply ports. A "dummy hole" as used herein may be a through hole or a non-through hole. The dummy holes are not used as liquid supply ports. Thus, according to the present invention, when a liquid path forming member is formed, the uncured material for forming the liquid path forming member flows not only into the liquid supply ports but also into the dummy holes so that both the boundary portion and the interior portion of the ejection port forming region can secure an equivalent level of surface flatness. Then, as a result, a liquid ejection head whose nozzle height can be controlled to be uniform with ease and that shows excellent liquid ejection performances can be obtained.

Figure 2:
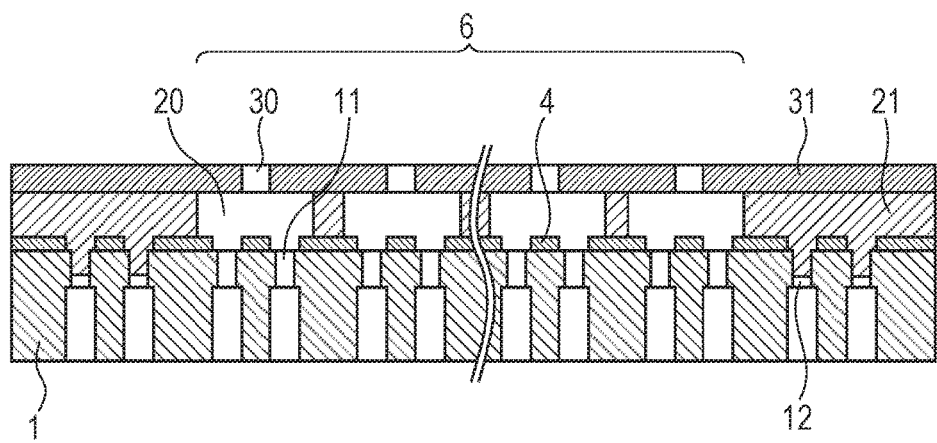
FIG. 2 is a schematic cross sectional view of the exemplary liquid ejection head that can be manufactured by a manufacturing method according to the present invention.

As shown in FIG. 2, the liquid path walls that define the lateral surfaces of the liquid path 20 are formed by the liquid path forming member 21, while the portions that operate as liquid path ceilings and through which the ejection ports 30 are formed are formed by an ejection port forming member 31. Note that the liquid supply ports 11 are made to communicate with the liquid chambers 20 and the ejection ports 30 that are related to them as the insulation/protection films and the adhesion layers 4 are subjected to a patterning operation that matches the openings of the liquid ejection ports 11 by means of photolithography or dry etching.

For the purpose of obtaining a liquid ejection head having the above-described configuration, a liquid ejection head manufacturing method according to the present invention is made to comprise a step of forming a liquid path forming member on the first surface of the substrate, using a first dry film resist, a step of forming an ejection port forming member on the liquid path forming member, a step of forming a liquid path in the liquid path forming member and a step of forming ejection ports in the ejection port forming member. Now, an embodiment of liquid ejection head manufacturing method according to the present invention will be described below by referring to FIGS. 3A through 3G. Note that FIGS. 3A through 3G are schematic cross sectional views of the liquid ejection head illustrated in FIGS. 1 and 2, showing different steps of the liquid ejection head manufacturing method.

Figure 3:
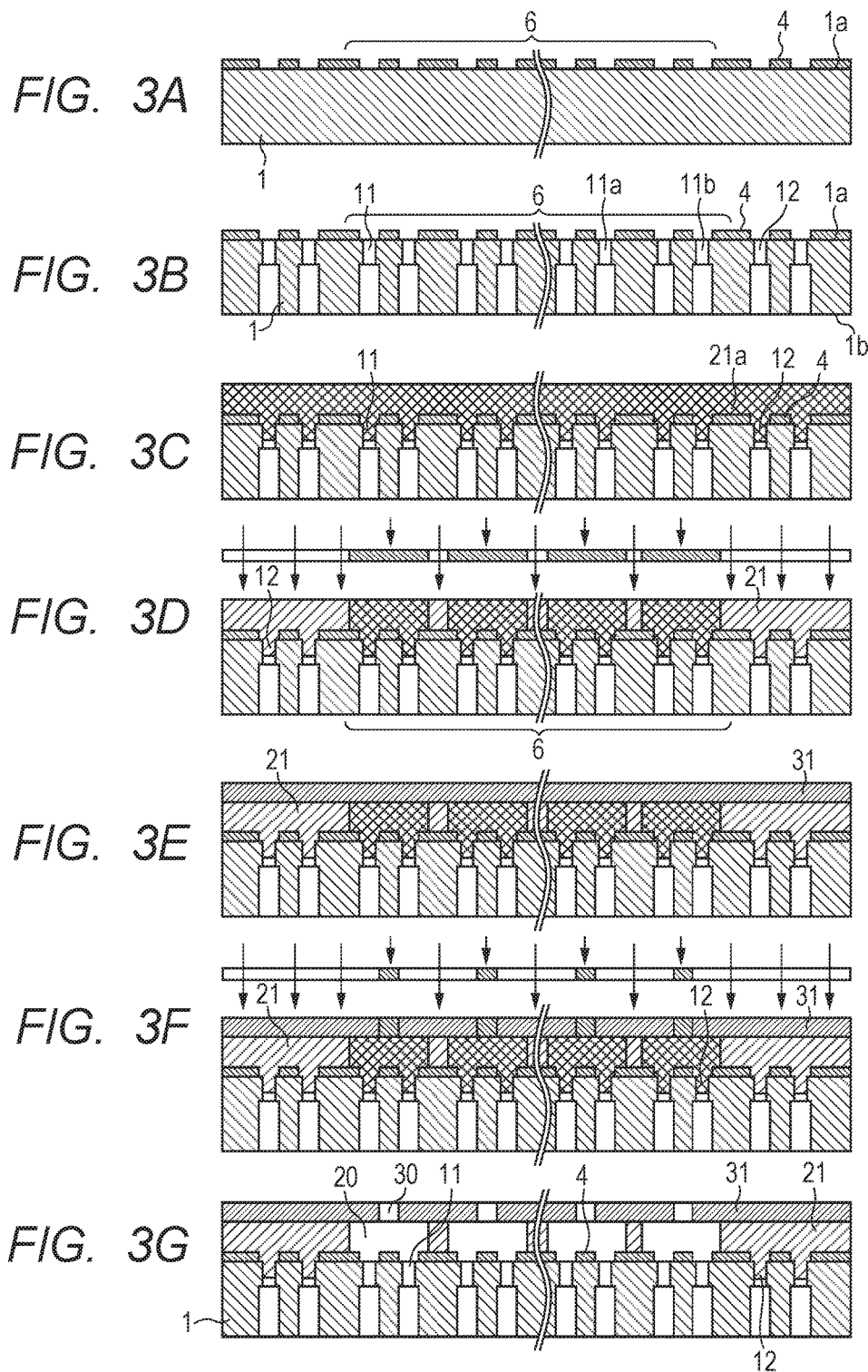
FIGS. 3A, 3B, 3C, 3D, 3E, 3F and 3G are schematic cross sectional views of the exemplary liquid ejection head being manufactured by a manufacturing method according to the present invention in different manufacturing steps thereof.

Firstly, a plurality of liquid ejection energy generating elements (not illustrated) are arranged on the first surface 1a of the substrate 1 and an insulation/protection film (not illustrated) is formed thereon as shown in FIG. 3A. Note that liquid ejection energy generating elements are arranged only in the inside of the ejection port forming region 6 and no liquid ejection energy generating elements are arranged outside the ejection port forming region 6. Also note that each liquid ejection energy generating element is a device that generates energy as it receives an electric signal or the like. Subsequently, a patterned adhesion layer 4 is formed on the insulation/protection film. The adhesion layer 4 is made of photosensitive resin and patterned by photolithography by way of exposure and development operations. Alternatively, a separate mask pattern may be formed on the adhesion layer and subsequently the adhesion layer may be subjected to a dry etching process by way of the mask pattern.

Any material can be used for the substrate 1 without any particular limitations provided that it can be used as a semiconductor element substrate, although silicon may be a suitable material for the substrate 1. The substrate 1 may typically be a silicon substrate. The use of a single crystal silicon substrate is particularly preferable. The liquid ejection energy generating elements may be made of a material that is a heat generating resistor and can heat liquid according to electric signals so as to provide the liquid with ejection energy. A typical example of such a material is TaSiN. When thermal energy generating elements are used as the liquid ejection energy generating elements, the liquid ejection head manufactured by using such a thermal energy generating elements will be a bubble jet type liquid ejection head. However, the present invention is by no means limited to a bubble jet type liquid ejection head and a liquid ejection head according to the present invention may be a piezo jet type liquid ejection head that is realized by using piezoelectric elements. The insulation/protection film may typically be made of SiN, SiC or SiO, although the material of the insulation/protection film is not subjected to any particular limitations so long as it can protect the electric wiring of the liquid ejection head against liquid such as ink. Similarly, the material of the adhesion layer 4 is not subjected to any particular limitations so long as it can secure the tight adhesion of the insulation/protection film and the liquid path forming member and remain stable against the liquid that will be filled in the liquid path 20 when the liquid ejection head is put to use. Typical examples of materials that are suitable for the adhesion layer 4 include polyether-amide resins and epoxy resins.

Figure 4:
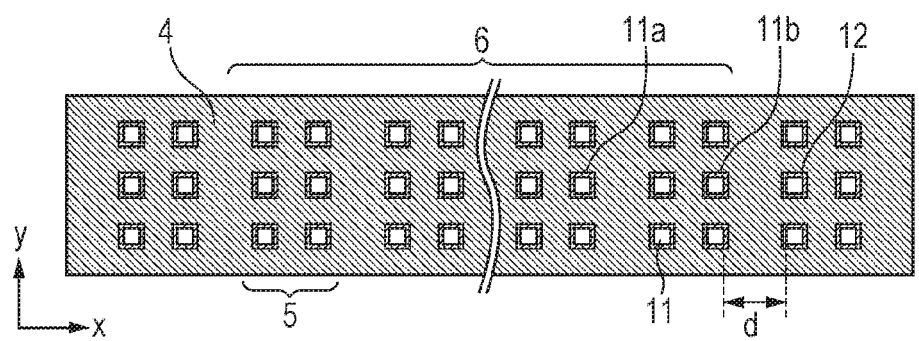
FIG. 4 is a top view of an exemplary substrate to be used for a liquid ejection head that can be manufactured by a manufacturing method according to the present invention.

Then, after patterning the mask resist on the adhesion layer 4, liquid supply ports 11 that run through the substrate 1 from the first surface 1a to the second surface 1b thereof and dummy holes 12 are formed as illustrated in FIG. 3B. As illustrated in FIG. 4, the liquid supply ports 11 are arranged side by side in the ejection port forming region 6, whereas the dummy holes 12 are arranged outside the region where the liquid supply ports are arranged side by side and hence the dummy holes 12 are located outside relative to the liquid supply ports 11b in the boundary portion (and hence outside the ejection port forming region 6). Note here that, while dummy holes 12 are arranged in two rows at the outside of the liquid supply ports 11b in the boundary portion as illustrated in FIGS. 3B and 4, dummy holes 12 are only required to be arranged at least in a row at the outside of the liquid supply ports 11b in the boundary portions. In other words, the present invention is by no means limited to the embodiment illustrated in FIGS. 3A through 3G and 4.

The above-described insulation/protection film may be patterned in advance so as to match the openings of the liquid supply ports 11 and those of the dummy holes 12 or, alternatively, the insulation/protection film may be patterned simultaneously with the operation of forming the liquid supply ports 11 and the dummy holes 12. The liquid supply ports 11 and the dummy holes 12 can be formed by dry etching after forming an etching mask or by wet etching after forming liquid introducing holes by laser processing. While the liquid supply ports 11 and the dummy holes 12 are formed after patterning the adhesion layer 4 in this embodiment, the sequence of execution of these steps is not necessarily limited to the above-described one.

For this embodiment, the dummy holes 12 that are formed outside the ejection port forming region 6 are preferably so processed as to provide an environment similar to that of the liquid supply ports 11a in the interior portion from the viewpoint of causing the resist arranged around the liquid supply ports 11b in the boundary portion to be easily fluidized than ever so as to secure surface flatness for the liquid path layer. More specifically, the liquid supply ports 11 and the dummy ports 12 are preferably so processed as to make the minimum distance between the edges of the openings of the dummy holes 12 on the first surface and the edges of the openings of the liquid supply ports 11b located in the boundary portion on the first surface substantially equal to the distance between the nozzle rows 5 and hence not less than 0.2 mm but not more than 1.0 mm. When the minimum distance between the edges of the openings of the liquid supply ports 11b located in the boundary portion and the edges of the openings of the dummy holes 12 is not less than 0.2 mm, the distance between the liquid supply ports in the boundary portion and the dummy holes would not be too small. Then, the amount of flow of resist in the surrounding areas of the liquid supply ports in the boundary portion would not be locally excessively increased if compared with the amount of flow of resist in the surrounding areas of the liquid supply ports in the interior portion and a situation where some of the surrounding areas of the dummy holes are deformed to show a recessed profile would be suppressed. When, on the other hand, the minimum distance between the edges of the openings of the liquid supply ports 11b located in the boundary portion and the edges of the openings of the dummy holes 12 is less than 1.0 mm, the distance between the liquid supply ports in the boundary portion and the dummy holes would not be too large. Then, the amount of flow of resist in the surrounding areas of the liquid supply ports in the boundary portion would not be locally excessively reduced if compared with the amount of flow of resist in the surrounding areas of the liquid supply ports in the interior portion and a situation where some of the surrounding areas of the dummy holes are deformed to show a protruding profile would be suppressed.

Note that the expression of "the liquid supply ports 11b in the boundary portion" as used in this specification refers to the liquid supply ports located in the boundary portion of the ejection port forming region 6. More specifically, the above-cited expression refers to the liquid supply ports that are arranged outermost among the plurality of liquid supply ports 11 arranged side by side in the inside of the ejection port forming region 6 and hence the liquid supply ports arranged in the rows that are located adjacent to the dummy holes 12. On the other hand, the expression of "the liquid supply ports 11a in the interior portion" refers to the liquid supply ports other than the liquid supply ports 11b in the boundary portion as described above. Additionally, the expression of "the edges of the openings of the liquid supply ports" refers to the outer peripheral edges of the openings of the liquid supply ports on the first surface 1a of the substrate 1. Therefore, the minimum distance between the edges of the openings of the liquid supply ports 11b located in the boundary portion and the edges of the openings of the dummy holes 12 means the minimum gap separating the openings. In the instance of the substrate illustrated in FIG. 4, the minimum distance is the distance between the edges of the openings of the liquid supply ports 11b in the boundary portion at the sides located closest to the dummy holes 12 and the edges of the openings of the dummy holes 12 at the sides located closest to the liquid supply ports 11b, which corresponds to d illustrated in FIG. 4. If necessary, dummy holes 12 may be formed along the opposite edges of the ejection port forming region 6 as viewed in the direction of the y-axis illustrated in FIG. 4.

Dummy holes 12 may or may not be through holes running through the substrate 1 provided that they have respective openings at the first surface 1a of the substrate 1. When the dummy holes 12 are not through holes running through the substrate 1, the processed depth of the dummy holes 12 should be sufficient for accommodating the amount of flow of the resist and preferably is not less than 100 μm. When the dummy holes are formed so as to run through the substrate 1, the openings of the liquid supply ports 11 having a greater width are formed at the second surface 1b of the substrate 1 and the openings of the liquid supply ports 11 having a smaller width formed at the first surface 1a are made to communicate with the respective openings formed at the second surface 1b. In this way, the dummy holes 12 can be formed simultaneously with the liquid supply ports 11.

Then, the first dry film resist 21a secured to a support member (not illustrated) is transferred onto the substrate 1 to produce a liquid path forming member 21 that covers the adhesion layer 4 as illustrated in FIG. 3C. The liquid path forming member 21 is only required to cover all the stepped portions of the adhesion layer 4 and may flow into the insides of the liquid supply ports 11 and the dummy holes 12. As the stepped portions of the adhesion layer 4 are covered, a situation where diffused reflections are produced in the exposure step and other steps that come thereafter to give rise an abnormal pattern and the air existing in the isolated spaces expands to deform some of the nozzles in the heating step that also comes thereafter.

The first dry film resist to be used for the liquid path forming member 21 is preferably a negative photosensitive resin. Examples of negative photosensitive resins that can be used for the liquid path forming member 21 include cyclized polyisoprene that contains bisazide compounds, cresol novolac resins that contain azidopyrene and epoxy resins that contain diazonium salts and/or onium salts. The material of the support member is, e.g., polyethylene terephthalate or polyimide although not subjected to any particular limitations so long as it is a material that is stable relative to the thermal history of the liquid path forming member. After the transfer, the thickness of the liquid path forming member 21 is reduced due to the heating and the pressurizing during the transfer operation from the thickness thereof before the transfer and the resin material of the liquid path forming member 21 flows into the liquid supply ports 11 and the dummy holes 12 by a volume that corresponds to the decrease of the height of the liquid path forming member 21. Note that the temperature and the pressure to be used for the transfer operation are such that the liquid path forming member 21 is softened and becomes to be able to cover the stepped portions of the adhesion layer 4 but the resin is not deteriorated. More specifically, for example, the temperature may be not lower than 60° C. and not higher than 140° C. and the pressure may be not lower than 0.1 MPa and not higher than 1.5 MPa. After transferring the first dry film resist onto the substrate, the support member is peeled off from the first dry film resist so that only the first dry film resist (the liquid path forming member 21) is left on the substrate.

Then, as illustrated in FIG. 3D, the part of the liquid path forming member 21 that is to be left and remain as permanent film is selectively exposed to light and subsequently subjected to a post-exposure heat treatment (to be referred to as PEB hereinafter) to optically determine the cured portions and the uncured potions. Since negative photosensitive resin is employed for the liquid path forming member 21 in this embodiment, the exposed portions become the cured portions. The cured portions correspond to the portions that become the liquid path walls.

Note here that, with the above-described known manufacturing method, some of the portions located outside the ejection port forming region 6 that are not to become liquid path walls may sometimes be left unexposed. However, at least part of the liquid path forming member that is located above the dummy holes is preferably cured in this embodiment. Note that the expression of "the liquid path forming member that is located above the dummy holes" means the part of the liquid path forming member that is formed outside the ejection port forming region 6. In FIG. 3D, all of the part of the liquid path forming member located above the dummy holes is exposed to light and cured without using any pattern. However, a pattern similar to the one to be used for the inside of the ejection port forming region or some other desirable pattern may be formed so as to cure at least some of the part of the liquid path forming member located above the dummy holes 12 and expose it to light. According to the present invention, due to the provision of the dummy holes 12, the difference between the amount of flow of the liquid path forming member 21 inside the ejection port forming region and the amount of flow of the liquid path forming member 21 outside the ejection port forming region is reduced during the transfer operation and therefore the surface flatness is secured at least between the boundary portion of the ejection port forming region and the interior portion of the ejection port forming region.

Thereafter, as illustrated in FIG. 3E, an ejection port forming member 31 is formed on the liquid path forming member 21. While there are no particular limitations to the technique of forming the ejection port forming member 31, the ejection port forming member 31 is preferably formed by a technique of transferring dry film resist secured to a support member as in the case of forming the liquid path forming member from the viewpoint of adjusting the sensitivity of the liquid path forming member 21 and that of the ejection port forming member 31. The dry film resist to be used for forming the ejection port forming member 31 (the second dry film resist) is preferably a negative photosensitive resin. Examples of negative photosensitive resins that can be used for the ejection port forming member 31 include cyclized polyisoprene that contains bisazide compounds, cresol novolac resins that contain azidopyrene and epoxy resins that contain diazonium salts and/or onium salts. Any of the materials similar to those listed above for forming the liquid path forming member may also be used for the latter support member. Note that the temperature and the pressure to be used for the transfer operation are such that they allow the liquid ejection port forming member 31 to be transferred and do not deform the liquid path forming member 21 that has already been formed. More specifically, for example, the temperature may be not lower than 30° C. and not higher than 50° C. and the pressure may be not lower than 0.1 MPa and not higher than 0.5 MPa. After transferring the second dry film resist, the support member is peeled off from the second dry film resist so that only the second dry film resist (the ejection port forming member 31) is left on the liquid path forming member.

Subsequently, as illustrated in FIG. 3F, the part of ejection port forming member 31 that needs to remain as permanent film is selectively exposed to light by way of a photo mask and then the cured portions and the uncured portions are optically determined by executing a PEB. Since a negative photosensitive resin is employed for the ejection port forming member 31 in this embodiment, the exposed portions become the cured portions. The cured portions correspond to the portions that become ejection port walls and liquid path ceilings for the ejection ports 30.

Thus, if ejection ports can be formed in the inside of the ejection port forming region and liquid path ceilings can be formed for the parts where liquid path walls exist in this embodiment, the outside of the ejection port forming region may also be exposed to light. For this embodiment, preferably at least part of the ejection port forming member 31 that is located above the dummy holes 12 is cured. The expression of "the ejection port forming member located above the dummy holes 12" refers to the part of the ejection port forming member that is formed outside the ejection port forming region 6. In FIG. 3F, all of the part of the ejection port forming member 31 that is located above the dummy holes 12 is exposed to light and cured so as to be combined with the liquid path forming member 21 and become integral with the ejection port forming region 6. Note, however, that a pattern similar to the one to be used for the inside of the ejection port forming region or some other desirable pattern may be formed so as to cure at least some of the part of the ejection port forming member located above the dummy holes 12 and expose it to light.

When a photosensitive resin whose photosensitivity type is the same as the liquid path forming member 21 is employed for the ejection port forming member 31, the material of the ejection port forming member 31 preferably shows photosensitivity higher than that of the liquid path forming member 21. More specifically, when negative photosensitive resins are employed respectively for the two members, the content ratio of the photo acid generator (PAG) contained in the ejection port forming member 31 may be made greater than the content ratio of the PAG contained in the liquid path forming member 21. Then, as a result, acid is generated in the inside of the ejection port forming member 31 but no acid is generated in the inside of the liquid path forming member 21 in the exposure step so that only the ejection port forming member 31 can selectively be patterned. Note that, alternatively, liquid repellent film may be formed on the upper surface of the ejection port forming member 31 and subsequently the ejection port forming member 31 may be exposed to light prior to this step. Also in such a case, the unexposed part of the liquid path forming member 21 does not give rise to any curing reaction when the ejection port forming member 31 is exposed to light in this step and hence only the ejection port forming member can selectively be patterned.

Then, as illustrated in FIG. 3G, the unexposed part (uncured part) of the liquid path forming member 21 and that of the ejection port forming member 31 are dissolved and removed by means of a liquid that can dissolve them and the two members are subjected to a developing operation. Preferably, the unexposed part of the liquid path forming member 21 and that of the ejection port forming member 31 are collectively subjected to a single developing operation so that the both members may be produced simultaneously and collectively. Note that the expression of "collectively subjected to a single developing operation" as used herein refers to that all the layers are subjected to a single developing operation. As the unexposed parts are removed in this step, the liquid path 20 and the ejection ports 30 are produced.

After the above-described steps, a liquid ejection head substrate having an ejection port forming region is obtained. Then, the liquid ejection head substrate is cut into chips typically by means of a dicing saw. Subsequently, the electric wiring for driving the liquid ejection energy generating elements of each of the chips is bonded to the chip and then a chip tank member for supplying liquid is also bonded to the chip. Then, as a result, finished liquid ejection heads are produced.

The above description of this embodiment shows an arrangement where the part of the liquid path forming member 21 and that of the ejection port forming member 31 that are located above the dummy holes 12 are also exposed to light so as to allow the part of the liquid path forming member and that of the ejection port forming member that are to become the nozzle part to remain around the dummy holes. Note, however, that the nozzle adhesion can be improved by curing all the liquid path forming member that is partly filled in the insides of the dummy holes. Furthermore, the present invention provides an advantage of securing the surface flatness in the ejection port forming region by using a substrate having dummy holes outside the plurality of liquid supply ports arranged side by side (outside the ejection port forming region). The present invention is applicable to instances where the arrangement illustrated in FIGS. 3A through 3G is repeated for a plurality of times so long as such instances also provide the above-described advantages of the present invention.

EXAMPLE 1

This example provides an advantage that the liquid path height of a liquid ejection head can be controlled with ease by forming dummy holes 12 that run through a substrate 1 and subsequently forming a liquid path forming member 21 on the substrate by transferring dry film resist. This example provides another advantage that the nozzle adhesion can be improved by curing the liquid path forming member that partly fills the insides of the dummy holes. Now, the method of manufacturing a liquid ejection head of this example will be described below by referring to FIGS. 3A through 3G.

As illustrated in FIG. 3A, a plurality of liquid ejection energy generating elements (not illustrated) were arranged on a silicon-made substrate 1 and an insulation/protection film (not illustrated) was formed thereon by means of plasma CVD using SiO and SiN. TaSiN was used as the material of the liquid ejection energy generating elements. The liquid ejection energy generating elements were arranged only inside the ejection port forming region 6 and subsequently an adhesion layer 4 was formed by using polyether-amide resins on the insulation/protection film and the portion thereof for forming liquid supply ports 11 and dummy holes 12 was subjected to a patterning operation. In the patterning operation, mask resist was patterned and subsequently subjected to a dry etching process. Thereafter, the mask resist was removed. The thickness of the formed adhesion layer 4 was 2 μm.

Then, after patterning the mask resist on the adhesion layer 4, liquid supply ports 11 and dummy holes 12 were formed so as to run through the substrate 1 from the first surface 1a to the second surface 1b of the substrate 1 by way of a Bosch process as illustrated in FIGS. 3B and 4. Thereafter, the mask resist was removed. Note that the liquid supply ports 11 were formed in the inside of the ejection port forming region 6, whereas the dummy holes 12 were formed outside the ejection port forming region 6. The dummy holes 12 were formed at a uniform pitch such that the minimum distance between the edges of the openings of the dummy holes and the edges of the openings of the liquid supply ports 11b in the boundary portion was made to be equal to 0.5 mm.

Then, as illustrated in FIG. 3C, a liquid path forming member 21 was formed on the insulation/protection film (not illustrated) and the adhesion layer 4 by means of a negative photosensitive resin (the first dry film), which was in the form of dry film rigidly secured on a support member, and a transfer apparatus so as to make the liquid path forming member 21 show a thickness of 14 μm on the liquid ejection energy generating elements. A mixture of 100 parts by mass of epoxy resin EHPE3150 (trade name, available from Daicel), 6 parts by mass of photo cationic polarization catalyst SP-172 (trade name, available from ADEKA) and 20 parts by mass of binder resin jER1007 (trade name, available from Mitsubishi Chemical) was employed for the negative photosensitive resin. PET film subjected to a release treatment was employed for the support member. Transfer apparatus VTM-200 (trade name, available from Takatori) was employed for the transfer operation. Temperature of 70° C. and pressure of 0.5 MPa were selected for the transfer operation. Subsequently, the support member was peeled off from the liquid path forming member 21 at a peeling speed of 5 mm/s.

Then, as illustrated in FIG. 3D, out of the liquid path forming member 21, the portions that become liquid path walls in a later stage and the portions located above the dummy holes 12 that are to be left to remain as permanent film were exposed to i-line (wavelength 365 nm) by way of a photo mask and by means of exposure device FPA-3000i5+ (trade name, available from CANON). A rate of 8,000 J/m$^2$ was selected for the exposure. Subsequently, the liquid path forming member 21 was heated to 50° C. for 4 minutes on a hot plate as PEB in order to accelerate the curing reaction.

Then, as illustrated in FIG. 3E, an ejection port forming member 31 was formed to a thickness of 10 μm on the liquid path forming member 21 by using a negative photosensitive resin (the second dry film) in the form of dry film, which was rigidly secured on a support member, and a transfer apparatus. A mixture of 100 parts by mass of epoxy resin EHPE3150 (trade name, available from Daicel) and 3 parts by mass of a photo cationic polymerization initiator onium salt was employed for the negative photosensitive resin. The onium salt shows a degree of sensitivity higher than the photo cationic polymerization catalyst SP-172 used for forming the liquid path forming member 21 and can generate cations with little exposure to light. PET film subjected to a release treatment was employed for the support member. Transfer apparatus VTM-200 (trade name, available from Takatori) was employed for the transfer apparatus. Temperature of 40° C. and pressure of 0.3 MPa were selected for the transfer operation. Subsequently, the support member was peeled off from the ejection port forming member 31 at a peeling speed of 5 mm/s.

Then, as illustrated in FIG. 3F, the portions of the ejection port forming member 31 that became liquid path ceilings in a later stage were exposed to i-line (wavelength 365 nm) by means of exposure device FPA-3000i5+ (trade name, available from CANON) to optically determine the cured portions that were to become the liquid path ceilings and the uncured portions that were to become the ejection ports. A rate of 1,000 J/m² was selected for the exposure. Note here that, while the unexposed portions of the liquid path forming member 21 were also exposed to i-line, the photo-sensitivities of the related materials had been adjusted as described above and hence the unexposed portions did not show any curing reactions when they were exposed to i-line during the exposure operation conducted on the ejection port forming member in this step. After the exposure operation, the ejection port forming member 31 was heated to 90° C. for 5 minutes on a hot plate as PEB so as to accelerate the curing reaction. Note that, in this example, all the portions of the ejection port forming member located above the dummy holes 12 were exposed to i-line without using any pattern so that the inside of the ejection port forming region and the outside of the ejection port forming region were unified to produce a larger ejection port forming region.

Then, as illustrated in FIG. 3G, the uncured portions of the liquid path forming member 21 and those of the ejection port forming member 31 were dissolved and removed by means of a solvent that can dissolve those uncured portions in order to collectively develop the liquid path forming member 21 and the ejection port forming member 31 and produce the liquid paths 20 and the ejection ports 30. Propylene glycol monomethyl acetate was employed as the solvent and the development process was executed for 15 minutes.

A substrate for liquid ejection heads having ejection port forming regions was obtained as a result of the above-described steps. Then, the substrate for liquid ejection heads was cut into chips by means of a dicing saw and each of the chips was subjected to a wiring operation for the purpose of driving the liquid ejection energy generating elements thereof. Subsequently, a chip tank member for supplying liquid was bonded to each of the chips. As a result, finished liquid ejection heads were produced. That the nozzles had uniformly been formed with a predetermined nozzle height and the liquid ejection heads had shown excellent ejection characteristics was confirmed as a result of operating the manufactured liquid ejection heads for printing. Additionally, the process control of the liquid ejection head manufacturing operation became facilitated as a result of measuring the depth of the liquid path forming member 21 that had flown into the dummy holes 12 and determining the correlation between the depth and the nozzle accuracy.

COMPARATIVE EXAMPLE

The liquid ejection head manufacturing method of Comparative Example will be described below by referring to FIGS. 5A through 5C. As illustrated in FIG. 5A, the liquid ejection head of this comparative example was manufactured by a method same as that of Example 1 except that the liquid path forming member 21 was formed without forming any dummy holes outside the ejection port forming region 6.

As illustrated in FIG. 5B, the first dry film same as that of Example 1 was transferred onto a silicon-made substrate 1, which already had liquid ejection ports 11 and an adhesion layer 4 patterned so as to correspond to the liquid ejection ports 11, to form a liquid path forming member 21 on the substrate 1 and subsequently the portions thereof that were to become liquid path walls were selectively exposed to light. Thereafter, a PEB was executed as in Example 1 to accelerate the curing reaction. Since only few liquid supply ports 11b were formed in the boundary portion, the resist fluidity was lower in the boundary portion for the liquid supply ports 11b than in the resist fluidity in the interior portion for the liquid supply ports 11a and, as a result, the surface of the liquid path forming member 21 was deformed.

Thereafter, as illustrated in FIG. 5C, an ejection port forming member 31 was formed on the liquid path forming member 21 and the part thereof to be left as permanent film was exposed to light as in Example 1. The materials used for the liquid path forming member and the support members were the same as those of Example 1. Similarly, the degree of exposure was the same as that of Example 1. After the exposure operation, a PEB was executed to accelerate the curing reaction. Subsequently, the liquid path 20 and the ejection ports 30 were formed by collectively developing the uncured portions of the liquid path forming member 21 and those of the ejection port forming member 31. The surface of the ejection port forming member 31 was found to have been deformed just like the surface of the liquid path forming member.

Subsequently, a liquid ejection head having a liquid path 20 and ejection ports 30 was prepared as in Example 1. As a result of conducting a printing operation using the obtained liquid ejection head, misdirection was observed at the ejection ports located around the liquid supply ports in the boundary portion. When the liquid ejection head was observed, unstable and non-uniform dimensions were found particularly in terms of ejection port diameter and liquid path height.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-007739, filed Jan. 19, 2016, which is hereby incorporated by reference herein in its entirety.

What is claimed is:

1. A method of manufacturing a liquid ejection head having an ejection port forming region including liquid ejection energy generating elements arranged on a first surface of a substrate along with electric wiring for driving the liquid ejection energy generating elements, a plurality of liquid supply ports each running through the substrate and having an opening at the first surface of the substrate, a liquid path formed on the first surface as a space containing the liquid ejection energy generating elements and the plurality of liquid supply ports, and ejection ports for ejecting liquid from the liquid path by driving the liquid ejection energy generating elements, the method comprising:

a step of forming a liquid path forming member on the first surface of the substrate, using a first dry film resist;

a step of forming an ejection port forming member on the liquid path forming member;

a step of forming the liquid path in the liquid path forming member; and a step of forming the ejection ports in the ejection port forming member, wherein the substrate has dummy holes each having an opening at the first surface of the substrate outside the ejection port forming region, and wherein the step of forming the liquid path includes a step of curing at least part of the liquid path forming member located above the dummy holes.

2. The method according to claim 1, wherein a minimum distance between edges of openings of the dummy holes and edges of openings of the plurality of liquid supply ports is 0.2 mm to 1.0 mm.

3. The method according to claim 2, wherein the step of forming the liquid path includes a step of curing all the liquid path forming member located above the dummy holes.

4. The method according to claim 2, wherein the step of forming the ejection port forming member includes use of a second dry film resist, and wherein the step of forming the ejection ports includes a step of curing at least part of the ejection port forming member located above the dummy holes.

5. The method according to claim 4, wherein the step of forming the ejection ports includes a step of curing all the ejection port forming member located above the dummy holes.

6. The method according to claim 1, wherein the step of forming the liquid path includes a step of curing all the liquid path forming member located above the dummy holes.

7. The method according to claim 1, wherein the step of forming the ejection port forming member includes use of a second dry film resist, and wherein the step of forming the ejection ports includes a step of curing at least part of the ejection port forming member located above the dummy holes.

8. The method according to claim 7, wherein the step of forming the ejection ports includes a step of curing all the ejection port forming member located above the dummy holes.

9. The method according to claim 1, wherein a depth of the liquid path forming member that has flown into the dummy holes is measured for process control.

* * * * *